United States Patent [19]

Tsuyoshi et al.

[11] Patent Number: 5,800,722
[45] Date of Patent: Sep. 1, 1998

[54] MULTILAYER PRINTED WIRING BOARD AND PROCESS FOR MANUFACTURING THE SAME

[75] Inventors: Hiroaki Tsuyoshi, Omiya; Tetsuro Sato, Ageo, both of Japan

[73] Assignee: Mitsui Mining & Smelting Co., Ltd., Japan

[21] Appl. No.: 640,491

[22] Filed: May 1, 1996

[30] Foreign Application Priority Data

May 1, 1995 [JP] Japan .................... 7-128767

[51] Int. Cl.⁶ .................................... B44C 1/22
[52] U.S. Cl. .................. 216/13; 216/20; 216/33; 216/41
[58] Field of Search ................ 216/13, 20, 33, 216/41, 105

[56] References Cited

U.S. PATENT DOCUMENTS

| | | | |
|---|---|---|---|
| 2,852,421 | 9/1958 | Bergstedt | 148/6.14 |
| 3,172,921 | 3/1965 | Flowers | 260/836 |
| 4,775,444 | 10/1988 | Cordani | 216/20 |
| 4,985,294 | 1/1991 | Watanabe et al. | 428/209 |
| 5,501,350 | 3/1996 | Yoshida et al. | 216/20 |

FOREIGN PATENT DOCUMENTS

| | | |
|---|---|---|
| 3296587 | 12/1991 | Japan . |
| 5255651 | 10/1993 | Japan . |
| 6128547 | 5/1994 | Japan . |
| 6216520 | 8/1994 | Japan . |
| 2140827 | 12/1984 | United Kingdom . |

*Primary Examiner*—William Powell
*Attorney, Agent, or Firm*—Morrison Law Firm

[57] ABSTRACT

A multilayer printed wiring board wherein an inner-layer copper circuit is provided on one or both of the surfaces of an inner-layer substrate, and subsequent copper circuit is cumulatively provided through an insulating layer on the outside of the inner-layer copper circuit, characterized in that the inner-layer copper circuit has a cuprous oxide film formed on the surface thereof the insulating layer which remarkably facilitate the interlayer adhesion between the inner-layer copper circuit. This multilayer printed wiring board has high interlayer adhesiveness and moistureproofness without causing any haloing phenomena when soaked with an acidic solution.

4 Claims, 1 Drawing Sheet

MULTILAYER PRINTED WIRING BOARD AND PROCESS FOR MANUFACTURING THE SAME

BACKGROUND OF THE INVENTION

1. Field of the Invention

This invention relates to a multilayer printed wiring board for use in making electronic circuits and to a method of manufacturing the multilayer printed wiring board. More particularly it relates to such a multilayer printed wiring board which is excellent in properties such as adhesion of an inner-layer copper circuits to an outer-layer substrate and moisture resistance and to a method of manufacturing such a multilayer printed wiring board.

2. Prior Art

FIG. 1 shows a cross-section of a multilayer printed wiring board having four-ply circuit layers. Referring to FIG. 1, a conventional multilayer printed wiring board is formed by the steps of bonding copper foils respectively on both surfaces of an inner-layer substrate 1 made of a prepreg comprising a glass cloth impregnated with an epoxy resin, masking predetermined portions of the copper foils, etching the unmasked portions of copper foils to form copper circuits 2, 2 respectively on both surfaces of the inner layer 1, bonding outer-layer substrates 3, 3 respectively on the surfaces of the inner-layer copper circuits 2, 2, the outer-layer substrates 3, 3 being made of the same kind of prepreg as mentioned above, bonding copper foils respectively on the outer surfaces of the outer-layer substrates 3, 3, masking predetermined portions of the copper foils, and etching these unmasked portions of the copper foils to form outer-layer copper circuits 4, 4. Furthermore, if required, the inner-layer copper circuits 2, 2 and the outer-layer copper circuits 4, 4 are connected with each other via a through-hole or through-holes. In this case, the inner-layer copper circuits 2, 2 are subjected to a black oxide treatment (a blackening treatment) or to soft etching so as to form fine nodules in order to ensure sufficient adhesion of the inner-layer copper circuits 2, 2 to the outer-layer substrates 3, 3. Thereafter, the inner-layer copper circuits 2, 2 are adhered onto the outer-layer copper foil 4, 4 with the outer-layer substrates 3, 3 being interposed therebetween. At this time, the nodules formed by the blackening treatment can improve the inner-layer copper circuits 2, 2 in adhesiveness to the outer-layer substrates 3, 3, in moisture resistance and in other various properties of the inner-layer members for the multilayer printed wiring board (properties required for an inner-layer member 5 which is a composite consisting of the inner-layer substrate 1 and the inner-layer copper circuits 2, 2).

Although the aforementioned black oxide treatment can improve adhesion between the inner-layer copper circuits and the outer-layer substrates, the following deterioration phenomenon is caused due to the formation of a thick cupric oxide film resulting from the black oxide treatment. Namely, when a through-hole is formed between the inner-layer copper circuits and the outer-layer copper circuits, the portion of the through-hole thus formed is soaked with an acid plating solution after which the acid solution penetrates into the interface between the inner-layer copper circuit and the outer-layer substrates, thus giving rise to degradation which is a so-called haloing phenomenon resulting from the dissolution of the cupric oxide film. On the other hand, when a soft etching method is employed, fine nodules can be hardly formed on the inner-layer copper circuit so that the possibility of presenting the haloing phenomenon can be minimized. In this case, however, it is very difficult to achieve a sufficient adhesion between the inner-layer copper circuit and the outer-layer substrate.

In an attempt to solve these problems, Satoh et al. have proposed as shown in Japanese Patent Application No. 25,809/95 a method wherein a resin-coated copper foil is used and directly laminated on the untreated surface of the inner-layer copper circuit instead of using both of the outer-layer prepreg (the outer-layer substrate) and the outer-layer copper foil, which does not require a black oxide treatment on the surface of the inner-layer copper circuit, and makes it possible to attain the aforementioned properties required for the inner-layer member. With this method, it is certainly possible to avoid an occurrence of the haloing phenomenon. However, a multilayer printed wiring board obtainable by this method is inferior in adhesiveness and moisture resistance to that obtainable by the black oxide treatment.

SUMMARY OF THE INVENTION

An object of the present invention is to provide a multilayer printed wiring board which is causing no haloing phenomenon and excellent in adhesion of an inner-layer copper circuits to an outer-layer substrate and moisture resistance. Another object is to provide a method of manufacturing such a multilayer printed wiring board. The above objects of this invention can be achieved by forming a cuprous oxide film on the surface of the inner-layer copper circuit and appling an outer insulating layer comprising 40–70 wt. % of an epoxy resin, 20–50 wt. % of a polyvinyl acetal resin and 0.1–20 wt. % of a melamine resin or urethane resin, each based on the total amount of the resin ingredients, with the proviso that 5–80 wt. % of said epoxy resin is a rubber-modified epoxy resin.

The multilayer printed wiring board of this invention wherein an inner-layer copper circuit is provided on one or both of the surfaces of an inner-layer substrate, and at least one subsequent copper circuit is cumulatively provided through an insulating layer on the outside of said inner-layer copper circuit, is characterized in that an inner-layer copper circuit has a cuprous oxide film formed on the surface thereof and the insulating layer which remarkably facilitates the interlayer adhesion between the inner-layer copper circuit and the insulating layer.

The process for the preparation of a multilayer printed wiring board of this invention comprises the steps of:

(1) adhering a copper foil to one or both of the surfaces of an inner-layer substrate, masking predetermined portions of the surface of said copper foil and then etching the unmasked portion of the copper foil to form copper circuit, (2) forming a cuprous oxide film on the surface of said copper circuit, (3) laminating under heat and pressure a copper foil having a semi-cured insulating layer formed on one surface thereof on the copper circuit formed on one or both of surfaces of the substrate with the insulating layer facing to said copper circuit, the insulating layer comprising 40–70 wt. % of an epoxy resin, 20–50% of a polyvinyl acetal resin and 0.1–20 wt. % of a melamine resin or urethane resin, each based on the total weight of the resin ingredients, with the proviso that 5–80% by weight of said epoxy resin is a rubber-modified resin, and then (4) masking predetermined portions of said copper foil so laminated, followed by etching the unmasked portions of the copper foil to form outer-layer copper circuits.

Further, according to this invention, the above-mentioned steps (2), (3) and (4) may be repeated as many times as desired to increase layers.

The multilayer printed wiring board of this invention is characterized in that a cuprous oxide is formed on the surface of the inner-layer copper circuit formed on one or both of the surfaces of an inner-layer substrate as described above without subjecting the surface of the inner-layer copper circuit to the aforementioned black oxide treatment, and an insulating layer (a resin layer) having a specific composition is employed.

In this invention, the inner-layer copper circuit formed on one or both of the surfaces of the inner-layer substrate may be one that can be obtained by etching an electrolytic copper foil or a rolled copper foil, or may be one that can be formed by means of an additive process. There is no particular limitation in the specific manufacturing method for forming thereof and in the thickness of a copper foil. Likewise, there is no limitation placed on kind of substrate and thickness of the inner-layer substrate as long as the thickness thereof is sufficient enough to be effective as an insulating layer.

The formation of a cuprous oxide film on the surface of the inner-layer copper circuit according to this invention can be performed by making use of an alkali treatment. The alkali treatment can be performed by using sodium hydroxide, potassium hydroxide and the like. In order to obtain a uniform film of cuprous oxide, an additive should preferably be employed. Examples of the additive are salts such as sodium sulfate, sodium citrate and sodium acetate, and a surfactant. The cuprous oxide film can be formed by dipping the inner-layer copper circuit formed on one or both of the surfaces of the inner-layer substrate in an alkali treatment solution, or by spraying the solution on the surface of the inner-layer copper circuit. The cuprous oxide film thus formed consists only of cuprous oxide and is free from cupric oxide, copper hydroxide or the like.

This alkali treatment solution may preferably be composed of, for example, 20 to 150 g/l of sodium hydroxide and 2 to 30 g/l of sodium sulfate and may preferably be used at a liquid temperature of 30° to 60° C. and for 0.5 to 5 minutes.

The insulating layer comprises 40–70 wt. % of an epoxy resin, 20–50 wt. % of a polyvinyl acetal resin and 0.1–20 wt. % of a melamine resin or urethane resin, each based on the total amount of the resin components, with the proviso that 5–80 wt. % of said epoxy resin is a rubber-modified epoxy resin.

The epoxy resin used in the above insulating layer may be such that it is a commercially available one for use in a substrate of a printed wiring board and in molding electronic elements. These commercially available resins may be used without any specific limitation. The epoxy resins so used include a bisphenol A-type epoxy resin, bisphenol F-type resin, novolak-type epoxy resin, o-cresol novolak-type epoxy resin, glycidyl amine compounds such as triglycidyl isocyanurate and N, N-diglycidyl aniline, and brominated epoxy resins such as tetrabromobisphenol A diglycidyl ether. These epoxy resins may be used singly or jointly. Further, they are not particularly limited in polymerization degree and epoxy equivalent as epoxy resins.

The curing agents for use in curing the epoxy resins preferably include generally known latent curing agents such as dicyandiamide, organic hydrozide and imidazole, and a phenol novolak resin which is difficultly curable at normal temperature. The optimum amounts of these curing agents added to the respective epoxy resins are known and, however, the amounts added may be varied as far as the curing agents maintain their effects as curing agents. Further, these curing agents may be used singly or jointly. Epoxy resin cure accelerators such as a tertiary amine may preferably be additionally used.

The amount of the epoxy resin used in said insulating layer is 40–70% by weight of the total of the resin ingredients. If the amount used is less than 40 wt. % then the resulting printed wiring board will be deteriorated in electrical properties and heat resistance, while if the amount used exceeds 70 wt. % then the resin will run out too much from the insulating layer during a heat and press at the time of the formation of a multilayer whereby adhesiveness between the circuits and insulating layers and insulating property thereof are lowered.

The rubber-modified epoxy resins used as a part of the epoxy resins which constitute the insulating layer in this invention may be commercially available ones for use as adhesives or paints, and these commercially available ones may be used without any particular limitations. They are illustrated by "EPICLON TSR-960" (tradename and produced by Dai Nippon Ink Mfg. Co.), "EPOTOHTO YR-102" (tradename and produced by Tohto Kasei Co.), "SUMIEPOXY ESC-500" (tradename and produced by Sumitomo Chemical Co.) and "EPOMIK VSR 3531" (tradename and produced by Mitsui Petrochemicals Co.). These rubber-modified epoxy resins may be used singly or jointly. The amount of the rubber-modified epoxy resins used herein is 5–80% by weight of the total of the epoxy resins. The adhesion of the insulating layer to the surface of the circuits (copper foils) which are not subjected to black oxide treatment is remarkably improved by the use of the rubber-modified epoxy resin in the insulating layer. If, however, the amount used is less than 5 wt. % then an improvement in adhesiveness will not be made, while the amount used is more than 80 wt. % then the insulating layer will be lowered in heat resistance.

The polyvinyl acetal resin used in the insulating layer according to this invention may be a resin which is synthesized by reacting a polyvinyl alcohol with an aldehyde. At the present, reaction products obtained by the reaction of polyvinyl alcohols having various polymerization degrees with at least one or more kinds of aldehydes, are marketed as polyvinyl acetal resins for use in paints and adhesives and, however, the polyvinyl acetal resin may be used in this invention irrespective particularly of the kinds of aldehydes and degree of acetalization. Although the degree of polymerization of polyvinyl alcohol as a starting material is not particularly limited, it is preferably in the range of 2000–3500 in view of the solubility to solvents and heat resistance of the resulting insulating layer. Further, modified polyvinyl acetals into the molecular of which carboxyl group or the like has been introduced are also commercially available and they may be used without any particular limitation if they raise no problems as to compatibility with epoxy resins. The amount of the polyvinyl acetal resins used is 20–50% by weight of the total of the resin ingredients. If the amount use is less than 20 wt. % then the effect of the aforementioned improvements in preventing the run out of the epoxy resin from the insulating layer is not achieved, while if the amount used exceeds 50 wt. % then the resulting cured insulating layer will increase in water absorptivity whereby the printed wiring board is deteriorated in water-proofing as such.

The adhesive used in this invention is, in addition to the above ingredient, incorporated with a melamine resin or a urethane resin as a cross-linking agent for the above polyvinyl acetal resin.

The melamine resin used herein may be a commercially available alkyl-etherified (alkylated) melamine resin for use for paints. Such a commercially available melamine is illustrated by a methylated melamine resin, n-butylated melamine resin, iso-butylated melamine resin or mixed alkylated melamine resin. The molecular weight and the alkylation degree of these melamine resins are not particularly restricted.

The urethane resins used in this invention include resins which contain isocyanate groups in the molecule and are commercially available for use for adhesives and paints. They are illustrated by reaction products of polyisocyanate compounds such as tolylene diisocyanate, diphenylmethane diisocyanate and polymethylenepolyphenyl polyisocyanate, with polyols such as trimethylalpropane, polyetherpolyol and polyesterpolyol. These reaction products (resins) are very reactive as resins and may be polymerized in the presence of atmospheric moisture in some cases and, therefore, it is preferable that these resins be stabilized with a phenol or oxime to prepare urethane resins called block isocyanates, for use in this invention.

The amount of a melamine resin or urethan resin incorporated in the insulating layer of this invention is 0.1–20% by weight of the total of the resin ingredients. If the amount used is less than 0.1% by weight then the polyvinyl acetal resin will not fully be crosslinked thereby the resulting insulating layer is deteriorated in heat resistance, while if the amount used is more than 20% by weight then adhesiveness of the resulting insulating layer to copper foils having not been subjected to surface roughening will be lowered.

In the preparation of the insulating layers, there may be used as required inorganic fillers typified by talc and aluminum hydroxide as well as an anti-foaming agent, a levelling agent, a coupling agent and the like, in addition to the aforementioned essential ingredients. The above optional ingredients are effective to improve the resulting insulating layer in levelness and smoothness, enhance the fire-retardation of the layer and lower a cost for the preparation of the layer. There is no limitation in the thickness of the resin.

The copper foil of the resin-coated copper foil to be employed in this invention may be an electrolytic copper foil or a rolled copper foil and the thickness of each of the copper foils may be 0.009 to 0.1 mm. A method of laminating the resin-coated copper foil onto the inner-layer copper circuit, can be performed under the same pressure, temperature and time as those employed conventionally for laminating a copper foil on an inner-layer substrate, i.e., any special pressing conditions are not required.

The multilayer printed wiring board of this invention can be manufactured by forming a cuprous oxide film on the surface of the inner-layer copper circuit formed in advance on the surface of an inner-layer substrate, masking predetermined portions of an outer-layer copper foil laminated via said insulating layer on the cuprous oxide film, and then subjecting the unmasked portions of the copper foil to etching treatment or the like thereby to form an outer-layer copper circuit.

Preferred Embodiments

Figure 1:
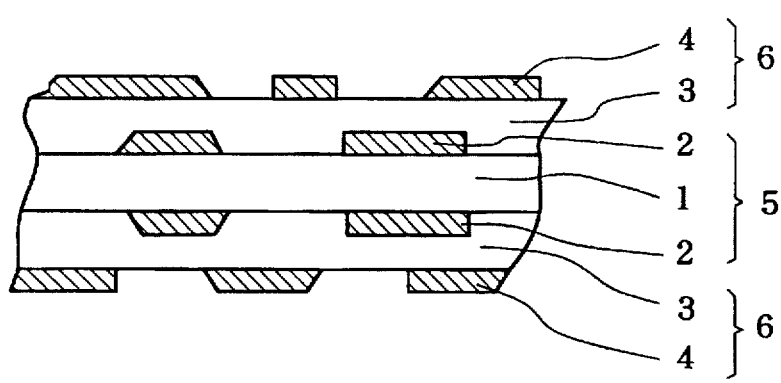
FIG. 1 is a cross-sectional view of a multilayer printed wiring board having four-layer copper circuits.

This invention will be better understood by the following Examples in comparison with Comparative Examples.

EXAMPLE 1

(1) Preparation of an inner-layer member consisting of an inner-layer substrate and inner-layer copper circuits.

Three sheets of commercially available 0.1 mm-thick epoxy resin impregnated glass cloth prepreg were overlapped one another to form an inner-layer substrate 1, a 0.035 mm-thick electrolytic copper foil having its one surface roughened was applied to each of the surfaces of the inner-layer substrate 1 with the roughened surface of the foil facing to the prepreg, and the whole was pressed together at a pressure of 30 kgf/cm$^2$ and a temperature of 170° C. for 60 min. thereby to form a laminate consisting of the inner-layer substrate both the surfaces of which are copper-clad (the laminate being an inner-layer member 5). Thereafter, predetermined portions of the surfaces of the thus formed inner-layer member 5 were masked, and the surfaces of the member 5 were etched to prepare inner-layer copper circuits 2, 2.

(2) Preparation of a cuprous oxide film

The inner-layer copper circuits 2, 2 formed on both sides of the inner-layer member 5 prepared in the above (1) were degreased and pickled. An alkali treatment solution having the following composition was heated to 50° C., and the inner-layer member 5 was dipped in the alkali treatment solution for one minute thereby to form a cuprous oxide films on both the faces of the inner-layer copper circuits 2, 2.

NaOH—25 g/l
Na$_2$SO$_4$—10 g/l (3) Preparation of resin-coated copper foils

In a 1:1 toluene/methanol mixed solvent were dissolved 40 parts by weight of an epoxy resin (tradename, EPOMIC R-301, produced by Mitsui Petrochemicals Co.), 20 parts by weight of a rubber-modified epoxy resin (tradename, EPO-TOHTO YR-102, produced by Tohto Kasei Co.), 30 parts by weight of a polyvinyl acetal resin (tradename, DENKA BUTYRAL No. 5000A, produced by Denki Kagaku Kogyo Co.), 10 parts by weight of a melamine resin (tradename, YUBAN 20 SB, produced by Mitsui Toatsu Kagaku Co.) as a solid, 2 parts by weight of a latent epoxy resin curing agent (dicyandiamide, reagent) which were added in the form of a 25 wt. % dimethylformamide solution, and 0.5 parts by weight of a cure accelerating agent (tradename, CURE SOL 2E4MZ, produced by Shikoku Kasei Co.), thereby to prepare a 25 wt. % resin varnish for preparation of insulation layers.

The thus prepared resin varnish was coated on the roughened face of 0.018 mm-thick electrolytic copper foils, air-dried and then heated at 150° C. for 7 minutes thereby to obtain resin-coated copper foils. The resin or insulating layers so obtained in this case were each 0.1 mm in thickness.

(4) Preparation of a multilayer printed wiring board

The inner-layer member 5 having the cuprous oxid films formed respectively on the copper foils of the member 5 in the above step (2) was washed with water and then warm air-dried, after which the resin-coated copper foils prepared in the above step (3) were placed respectively on both the faces of the inner-layer member 5 with the resin layer side of the resin-coated copper foil facing to the inner-layer copper circuit, thereafter the whole was pressed together at 30 kgf/cm$^2$ and 170° C. for 60 minutes to form outer-layer members respectively on both the faces of the inner-layer member, masking predetermined portions of both the faces (copper foils) of the outer-layer member formed in the above step (3), and then the partly masked faces (copper foils) of the outer-layer member were etched by an ordinary method to form outer-layer circuits, thereby to prepare a multilayer (4 layers in this case) printed wiring board as shown in FIG. 1.

EXAMPLE 2

A multilayer printed wiring board was prepared in the same manner as in Example 1 except that the step (2) of treating the surfaces of the inner-layer copper circuits carried out in Example 1 was replaced by a step of spraying an alkali treatment solution comprising the following composition onto the surfaces of the inner-layer copper circuits for one minute thereby to form cuprous oxide films thereon.

NaOH—25 g/l

Comparative Example 1

A multilayer printed wiring board was prepared in the same manner as in Example 1 except that the step (2) of Example 1 was omitted.

Comparative Example 2

A multilayer printed wiring board was prepared in the same manner as in Example 1 except that the step of alkali treatment in the step (2) of Example 1 was replaced by a step of dipping the inner-layer member 5 for three minutes in a black oxide treatment solution at 85° C. having the following composition.

NaClO$_2$—31 g/l
NaOH—15 g/l
Na$_3$PO$_4$—12 g/l

Comparative Example 3

A black oxide treatment was performed on the both surfaces of an inner-layer member in the same manner as in Comparative Example 2, and 0.018 mm-thick electrolytic copper foils were superimposed via respective 0.1 mm-thick glass epoxy prepregs on both surfaces (inner-layer copper circuits) of the inner-layer member 5 with the roughened surfaces of the copper foils being faced respectively to the prepregs. Subsequently, predetermined portions of the copper foils on both surfaces of the inner-layer member 5 were masked, and the partly masked copper foils were etched to form outer-layer copper circuits thereby obtaining a multi-layer printed wiring board.

The multilayer printed wiring boards obtained in Examples 1–2 and Comparative Examples 1–3 were evaluated for the following performances and properties. The results are as shown in Table 1.

(1) Normal-state peeling strength
   a) between the inner-layer copper circuit (0.035 mm thick) and the insulating layer
   b) between the outer-layer copper circuit (0.018 mm thick) and the insulating (resin) layer In accordance with JIS C 6481

(2) Haloing resistance

The boards are each perforated to make a through hole of 0.4 mm in diameter, and the perforated boards are each immersed in a 1:1 aqueous solution of hydrochloric acid at room temperature to visually determine whether haloing occurs or not.

(3) Solder heat resistance in boiling water

The boards are boiled in purified water for 3 hours and then immersed in a solder bath at 260° C. for 30 seconds to visually determine whether swelling occurs or not (between the inner-layer copper circuit and the insulating layer).

TABLE 1

| Ex. & Comp. Ex. | Normal-state peeling strength (kgf · cm) | | Haloing resistance *1 | Boiled solder heat resisance *2 |
|---|---|---|---|---|
| | Inner copper circuit/ insulating layer | Outer copper circuit/ insulating layer | | |
| Ex. 1 | 1.81 | 1.53 | O | O |
| Ex. 2 | 1.70 | 1.51 | O | O |
| Comp. Ex. 1 | 1.40 | 1.50 | O | X |
| Comp. Ex. 2 | 1.65 | 1.51 | X | O |
| Comp. Ex. 3 | 1.60 | 1.52 | X | X |

*1; O: Haloing not observed.
X: Haloing observed.
*2; O: Swelling not observed.
X: Swelling observed.

As apparent from Table 1, the multilayer printed wiring boards of Examples 1 and 2 wherein the cuprous oxide film was formed on the surface of each of the inner-layer copper circuits were superior in normal-state peeling strength and boiled solder heat resistance to the multilayer printed wiring board of Comparative Example 1 wherein such a cuprous oxide film was not formed on the surface of any of the inner-layer copper circuits. The multilayer printed wiring board of Comparative Example 2 wherein the black oxide treatment was performed exhibited haloing, whereas the multilayer printed wiring boards of Examples 1 and 2 indicated excellent haloing resistance. In the case of the multilayer printed wiring board of Comparative Example 3 wherein the black oxide treatment was performed and the copper foils were pressed respectively onto the prepregs (outer-layer substrates), the haloing resistance as well as the boiled solder heat resistance of the board was found to be poor, indicating insufficient bonding properties.

As explained above, the multilayer printed wiring boards obtained by this invention are such that the cuprous oxide formed on the surface of the inner-layer copper circuit is highly reactive to the functional group of the resin constituting the insulating layer, and the interlaminar adhesion between the inner-layer copper circuit and the insulating layer is remarkably strong. Moreover, since the surface of the cuprous oxide film has been finely roughened by the aforementioned alkali treatment, the adhesion between the inner-layer copper circuit and the insulating layer is further enhanced. Accordingly, it is possible according to this invention to obtain a multilayer printed wiring board which is free from occurrence of a haloing phenomenon and excellent in both adhesion strength and boiled solder heat resistance.

Furthermore, since the alkali treatment solution is not deteriorated with age unlike the black oxide treatment solution, frequent adjustment or renewal of the solution will not be required, hence this being advantageous from the economical viewpoint.

What is claimed is:

1. A process for the preparation of a multilayer printed wiring board comprising the steps of:
   (1) adhering a copper foil to one or both of the surfaces of an inner-layer substrate, masking portions of the surface of the copper foil so adhered and then etching the unmasked portions of the copper foil to form at least one copper circuit, (2) forming a cuprous oxide film on the surface of said at least one copper circuit, (3) laminating under heat and pressure at least one copper foil having a semi-cured insulating layer formed on one surface thereof on the at least one copper circuit having the cuprous oxide film formed thereon with said insulating layer facing to said cuprous oxide film, the insulating layer comprising 40–70% by weight of an epoxy resin, 20–50% by weight of a polyvinyl acetal resin and 0.1–20% by weight of a melamine resin or urethane resin, each based on the total weight of the resin ingredients, with the proviso that 5–80% by weight of said epoxy resin is a rubber-modified resin, and then (4) masking portions of said copper foil so laminated, followed by etching the unmasked portions of the copper foil to form at least one outer-layer copper circuit.

2. A process for the preparation of a multilayer printed wiring board according to claim 1, further comprising repeating said steps (2) to (4) as many times as desired.

3. A process for the preparation of a multilayer printed wiring board according to claim 1, wherein said step (2) is performed by alkali treatment.

4. A process for the preparation of a multilayer printed wiring board according to claim 2, wherein said step (2) is performed by alkali treatment.

* * * * *